United States Patent [19]
Dunstan et al.

[11] Patent Number: 5,694,607
[45] Date of Patent: Dec. 2, 1997

[54] SYSTEM POWER CONSUMPTION TRACKING AND REPORTING

[75] Inventors: Robert A. Dunstan, Beaverton; Kelan Silvester, Portland, both of Oreg.

[73] Assignee: Intel Corporation, Santa Clara, Calif.

[21] Appl. No.: 718,053

[22] Filed: Sep. 17, 1996

Related U.S. Application Data

[63] Continuation of Ser. No. 361,937, Dec. 22, 1994, abandoned.

[51] Int. Cl.$^6$ .................. G06F 1/00; G06F 1/18
[52] U.S. Cl. .......... 395/750; 395/651; 395/652; 395/828; 395/830; 395/835; 395/836
[58] Field of Search .................. 395/750, 835, 395/837, 838, 828, 830, 834, 284, 651, 653; 364/707

[56] References Cited

U.S. PATENT DOCUMENTS

| | | | |
|---|---|---|---|
| 5,339,445 | 8/1994 | Gasztonyi | 395/750 |
| 5,404,543 | 4/1995 | Faucher et al. | 395/750 |
| 5,404,546 | 4/1995 | Stewart | 395/750 |
| 5,410,713 | 4/1995 | White et al. | 395/750 |
| 5,465,357 | 11/1995 | Bealkowski et al. | 395/700 |
| 5,511,205 | 4/1996 | Kannan et al. | 395/750 |
| 5,560,022 | 9/1996 | Dunstan et al. | 395/750 |
| 5,586,324 | 12/1996 | Sato et al. | 395/652 |

*Primary Examiner*—Jack B. Harvey
*Assistant Examiner*—Raymond N. Phan
*Attorney, Agent, or Firm*—Blakely, Sokoloff, Taylor & Zafman

[57] ABSTRACT

A computer system with system power consumption tracking and reporting is disclosed including a background task that determines a hardware configuration of the computer system and that detects new or novel hardware configurations. The background task updates data sets in the system power table that correspond to previously logged hardware configurations and creates new data sets in the system power table for the new or novel hardware configurations. The system power table logs indications of system power consumption for the corresponding hardware configurations as well as related information.

28 Claims, 6 Drawing Sheets

SYSTEM POWER CONSUMPTION TRACKING AND REPORTING

This is a continuation of application Ser. No. 08/361,937, filed Dec. 22, 1994, now abandoned.

BACKGROUND OF THE INVENTION

1. Field of the Invention

The present invention pertains to the field of computer systems. More particularly, this invention relates to mechanisms for system level power consumption tracking and reporting in a computer system.

2. Background

Portable computer systems such as notebook computer systems typically accommodate a variety of components and devices. The components and devices of a portable computer system usually include permanently installed or resident devices. Such permanently installed devices typically include a resident disk drive and a resident floppy disk drive as well as a processor subsystem, a main memory and an input and display subsystem.

In addition, the components and devices of a portable computer system usually include optionally installed devices. Such optional devices may include for example a modem subsystem, other communication subsystems or additional types of mass storage subsystems. Such portable computer systems usually provide standardized interface slots that enable installation and removal of such optional devices. In addition, such portable computer systems may also provide standardized slots designed for the regular insertion and removal of peripheral devices such as modems or flash memory subsystems having standardized form factors.

Typically, portable computer systems include a battery-based power supply subsystem that supplies electrical current to the components and devices installed in the computer system. Such a battery power supply usually imposes and upper limit on the peak level of electrical power available to the computer system. In addition, such a battery power supply typically provides only a limited duration of electrical power to the computer system before requiring battery replacement or battery recharging with a power supply.

In such systems, the duration of electrical power available from such a battery power supply is usually determined by the charge level of the battery in combination with the power characteristics of the computer system hardware. For example, the power characteristics of the resident disk drive installed in the computer system and the power characteristics of the main memory in the computer system affects the system power consumption from the battery power supply. Also, the system power consumption in such a system typically varies as optional or removable devices are installed or removed from the standardized interface slots.

In addition, the duration of electrical power available from such a battery power supply may be affected by the software activities of the computer system. For example, an RF modem subsystem in such a portable computer usually consumes maximum power during communication transfers by fax or modem programs. In addition, computation intensive application programs such as graphics applications typically cause increased system power consumption by preventing the main processor or math coprocessor from entering a lower power consumption mode. A word processing application, on the other hand, typically yields reduced power consumption by allowing frequent entry into low power consumption modes.

Prior portable computer systems typically provide an indication of available battery duration through a user interface such as a run-time or fuel gauge indicator. Such a portable computer system usually generates a run-time or fuel gauge indication by estimating the level of system power consumption and the remaining capacity of the battery. Prior systems typically base an estimate of system power consumption on hard coded values of the power characteristics of the computer system. Such hard coded characterizations of system power consumption are commonly obtained by power consumption measurements during system manufacture.

Unfortunately, the actual electrical power consumption of such computer systems typically varies from such hard coded values. For example, the power consumption of optional or removable devices typically vary from the hard coded factory power characterizations. As a consequence, prior systems that rely on such hard coded power characterizations usually provide only a rough estimation of battery duration. Such inaccurate power estimations greatly reduces the utility of prior battery duration indicators In addition, such inaccurate power estimations may lead to unanticipated low battery power levels and consequential system failures. Moreover, such inaccurate power estimations may lead to poor power control decisions by power management software.

SUMMARY OF THE INVENTION

The present invention is a computer system that provides system power consumption tracking and reporting. The computer system implements a background task that determines a hardware configuration of the computer system by detecting the devices installed and that determines whether the hardware configuration is logged in a system power table in persistent storage. If the hardware configuration is logged in the system power table then the background task updates a data set in the system power table that corresponds to the hardware configuration such that the data set contains an indication of system power consumption for the hardware configuration. On the other hand, if the hardware configuration is not logged in the system power table then the background task creates a new data set in the system power table for the hardware configuration such that the new data set contains the indication of system power consumption for the hardware configuration. For other embodiments, the background task also logs software configurations and other related information in the system power table.

Other features and advantages of the present invention will be apparent from the accompanying drawings, and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

Figure 1:
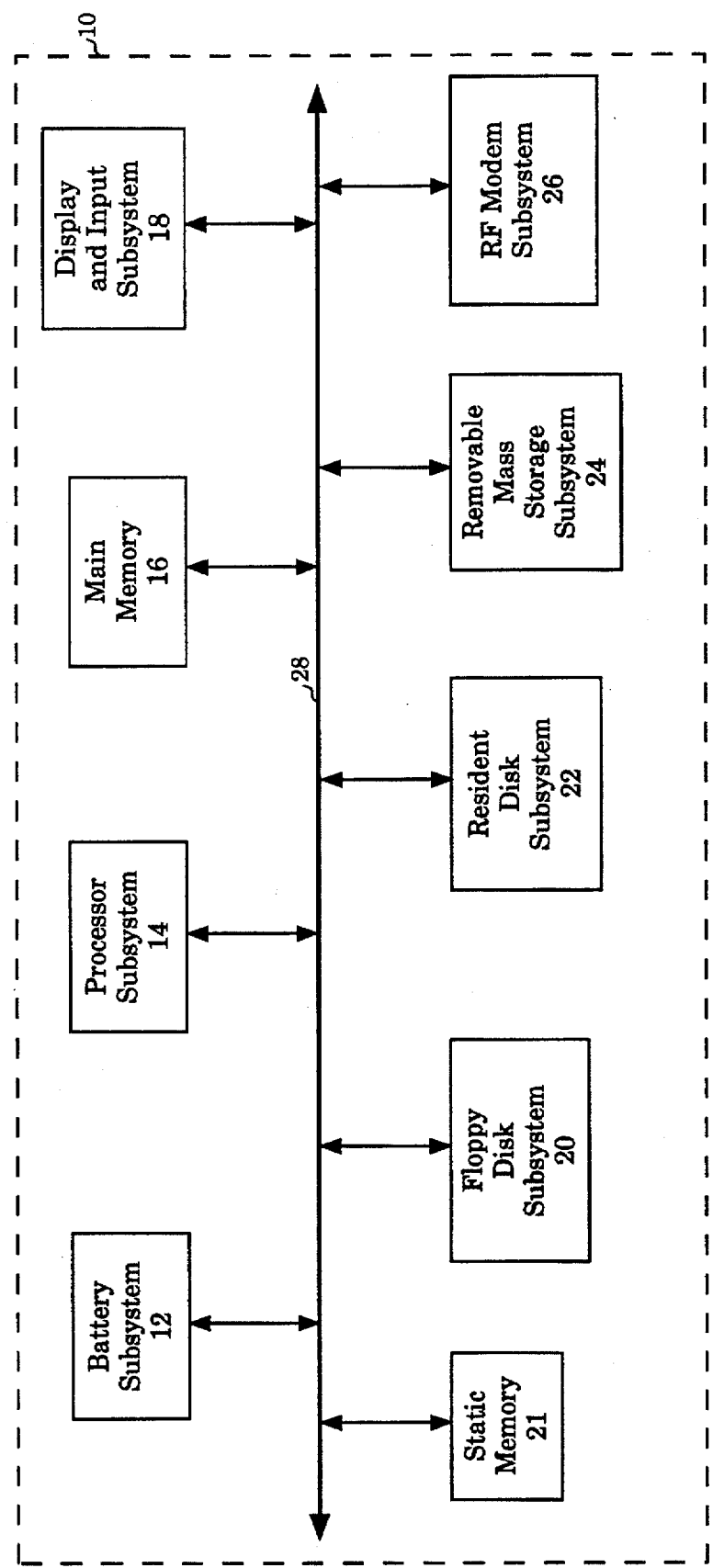
FIG. 1 illustrates a computer system for one embodiment which comprises a processor subsystem, a main memory, a display subsystem, a static memory, a floppy disk subsystem, a resident disk subsystem, a removable mass storage subsystem, and an RF modem subsystem.

FIG. 1 illustrates a computer system 10 for one embodiment. The computer system 10 comprises a processor subsystem 14, a main memory 16, a display and input subsystem 18, and a static memory 21. The computer system 10 further comprises a floppy disk subsystem 20, a resident disk subsystem 22, a removable mass storage subsystem 24, and an RF modem subsystem 26. The processor subsystem 14 communicates with the main memory 16, the display and input subsystem 18, the floppy disk subsystem 20, the static memory 21, the resident disk subsystem 22, the removable mass storage subsystem 24, and the RF modem subsystem 26 communicate via a system bus 28.

The main memory 16 provides storage areas for an operating system, a set of application programs and a set of associated device driver programs and data structures implemented on the computer system 10. For one embodiment, the main memory 16 comprises a dynamic random access memory subsystem.

The static memory 21 provides storage areas for a set of basic input/output software (BIOS) or a hardware abstraction layer (HAL) for the computer system 10. For one embodiment, the static memory 21 comprises a static random access memory with battery power back-up. For other embodiments, the static memory 21 comprises flash memory or other forms of non-volatile memory.

For one embodiment, the static memory 21 also provides a persistent storage for system power tables for the computer system 10. For other embodiments, the system power tables are stored on a mass storage device such as the resident disk subsystem 22, the floppy disk subsystem 20, or the removable mass storage subsystem 24 or are obtained via the RF modem subsystem 26.

The display and input subsystem 18 provides a display area that enables user interface functions for the computer system 10. The display and input subsystem 18 also provides software controllable intensity levels and backlighting functions. The amount of electrical current consumption of the display and input subsystem 18 varies according to the display intensity, contrast, and the level of backlighting intensity which may be reflected as hardware configurations in the system power tables.

The computer system 10 further comprises a removable mass storage subsystem 24 and a removable RF modem subsystem 26. The removable mass storage subsystem 24 and the RF modem subsystem 26 are routinely inserted and removed from the computer system 10 via standardized sockets coupled to the system bus 28. Such standardized sockets may comprise, for example, Personal Computer Memory Card International Association (PCMCIA) slots. The electrical power consumption of the removable mass storage subsystem 24 and the RF modem subsystem 26 varies according to a set of corresponding operating phases. The RF modem subsystem 26 consumes a relatively high level of electrical current during fax or data transfers and a relatively low standby level of electrical current when fax or data transfers are not underway.

The computer system 10 further comprises a battery subsystem 12. The battery subsystem 12 provides electrical power to the various components and devices of the computer system 10 via a set of electrical power lines that are included with the system bus 28. The battery subsystem 12 provides mechanisms for reporting the amount of electrical current available.

Figure 2:
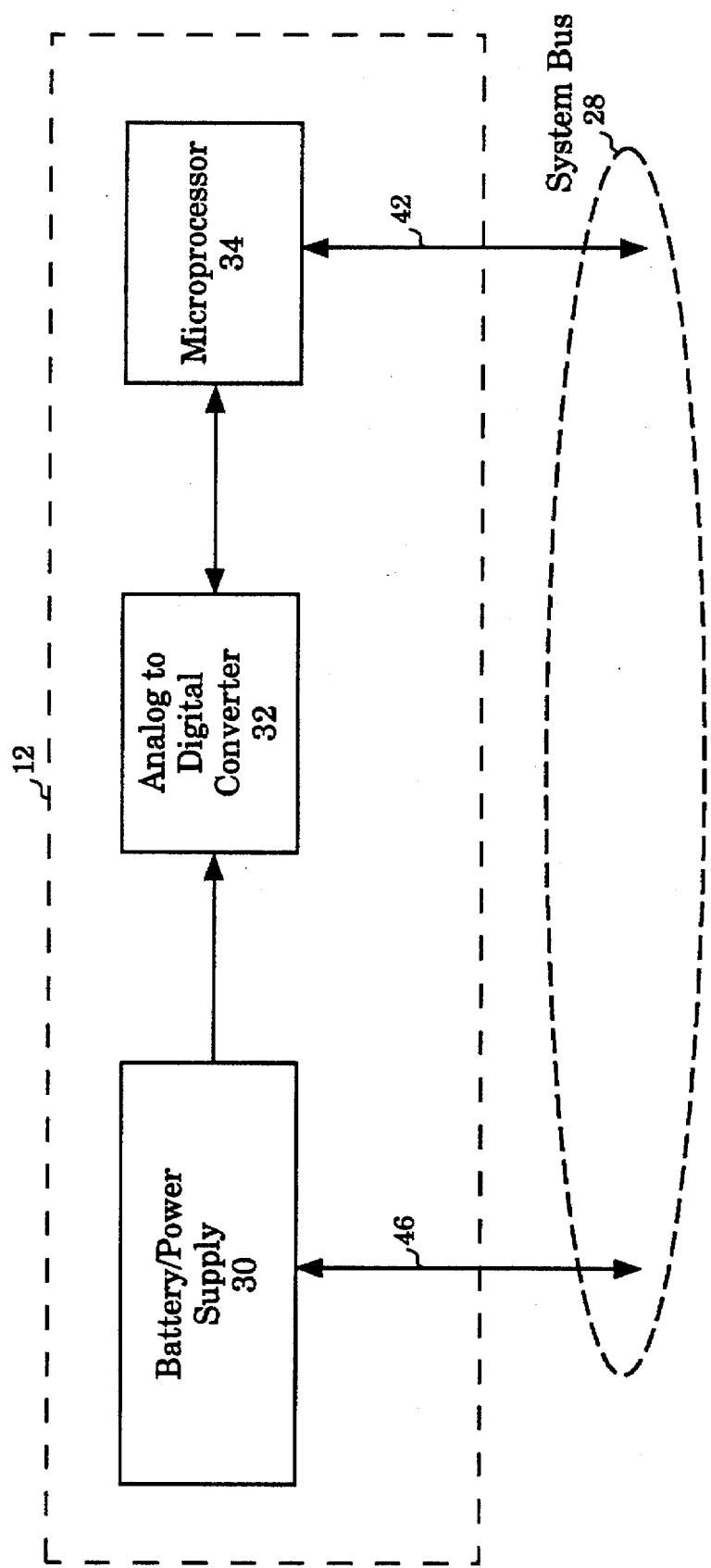
FIG. 2 illustrates a battery subsystem for one embodiment which comprises a battery/power supply, an analog to digital converter, and a microprocessor.

FIG. 2 illustrates the battery subsystem 12 for one embodiment. The battery subsystem 12 comprises a battery/power supply 30, an analog to digital converter 32, and a microprocessor 34.

The battery/power supply 30 provides a set of DC electrical currents via a set of power lines 46 for the computer system 10. The electrical currents supplied by the battery/power supply 30 include a predetermined set of voltage levels required by the devices and components coupled to the system bus 28 which may include 5 volts, 12 volts, and 3.3 volts.

The analog to digital converter 32 samples the voltage levels, electrical current levels, and temperature levels generated by the battery/power supply 30. The analog to digital converter 32 converts the sampled analog voltage, current, and temperature signals to digital data under the control of the microprocessor 34.

The microprocessor 34 is programmed with the characteristic curves for the battery in the battery/power supply 30. The microprocessor 34 uses the digitized voltage, current, and temperature levels sensed from the battery/power supply 30 to determine the amounts of electrical power supplied by the battery subsystem 12 and to calculate the remaining power in the battery subsystem 12.

The processor subsystem 14 communicates with the microprocessor 34 via a set of battery control lines 42. The processor subsystem 14 transfers battery messages to the microprocessor 34 via the battery control lines 42 to query the power levels of the battery/power supply 30. The battery messages also include messages that enable the processor subsystem 14 to query the amount of electrical current being supplied by the battery/power supply 30 which, in effect, provides an electrical power meter function. The processor subsystem 14 transfers the battery messages to the microprocessor 34 in order to sample the electrical current generated by the battery/power supply 30 at any given time.

Figure 3:
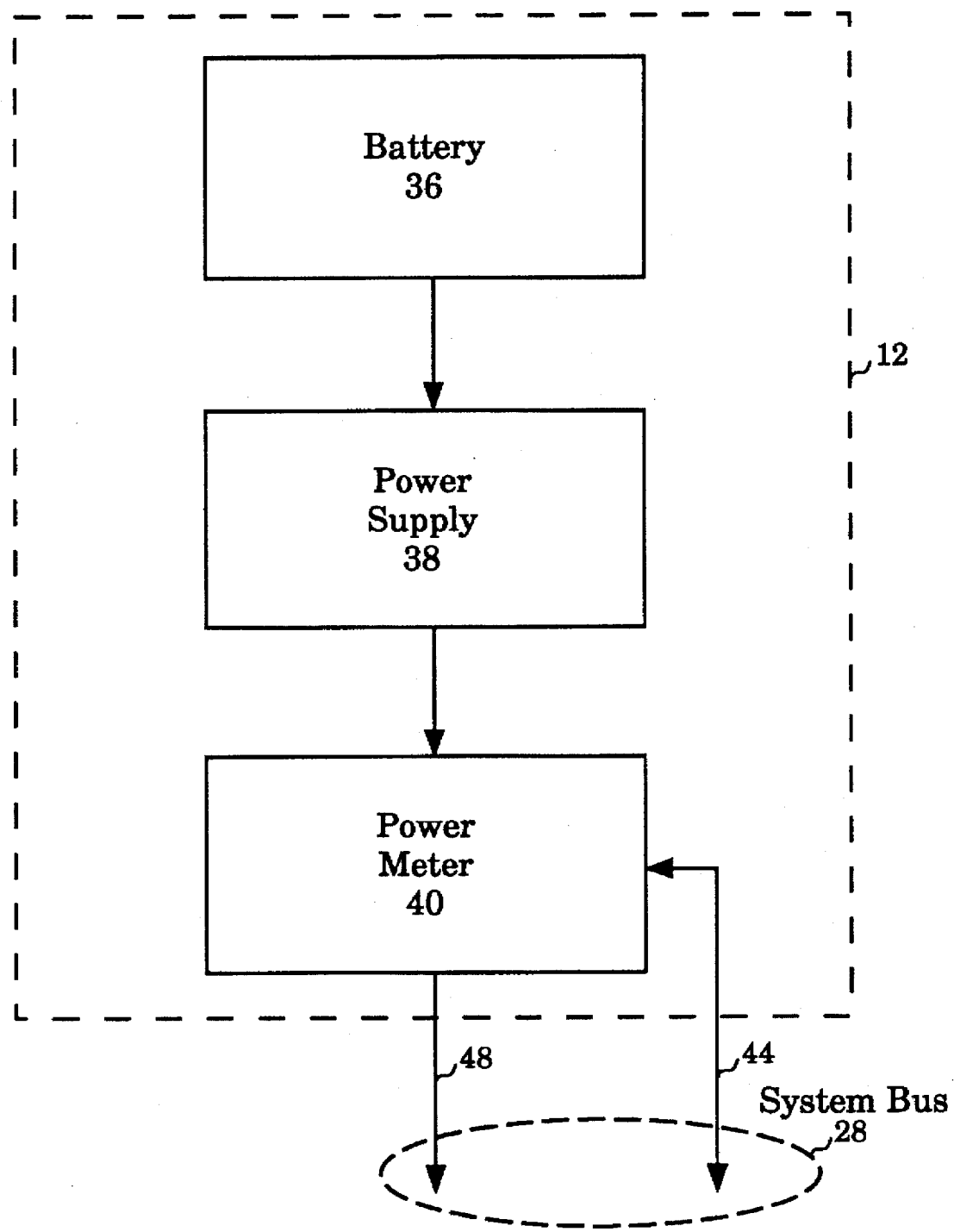
FIG. 3 illustrates a battery subsystem which comprises a battery, a power supply, and a power meter.

FIG. 3 illustrates the battery subsystem 12 for another embodiment which comprises a battery 36, the power supply 38, and a power meter 40. The battery 36 supplies electrical current to the power supply 38. The power supply 38 generates the various electrical currents at the voltage levels required by the components and devices of the computer system 10. The electrical currents are supplied to the computer system 10 via a set of power lines 48.

The power meter 40 measures the electrical current levels generated by the battery 36 and the power supply 38. The processor subsystem 14 reads the electrical current level sensed by the power meter 40 via a set of signal lines 44. The power meter 40 enables the processor subsystem 14 to sample the electrical current levels generated by the battery subsystem 12 at any given time.

Figure 4:
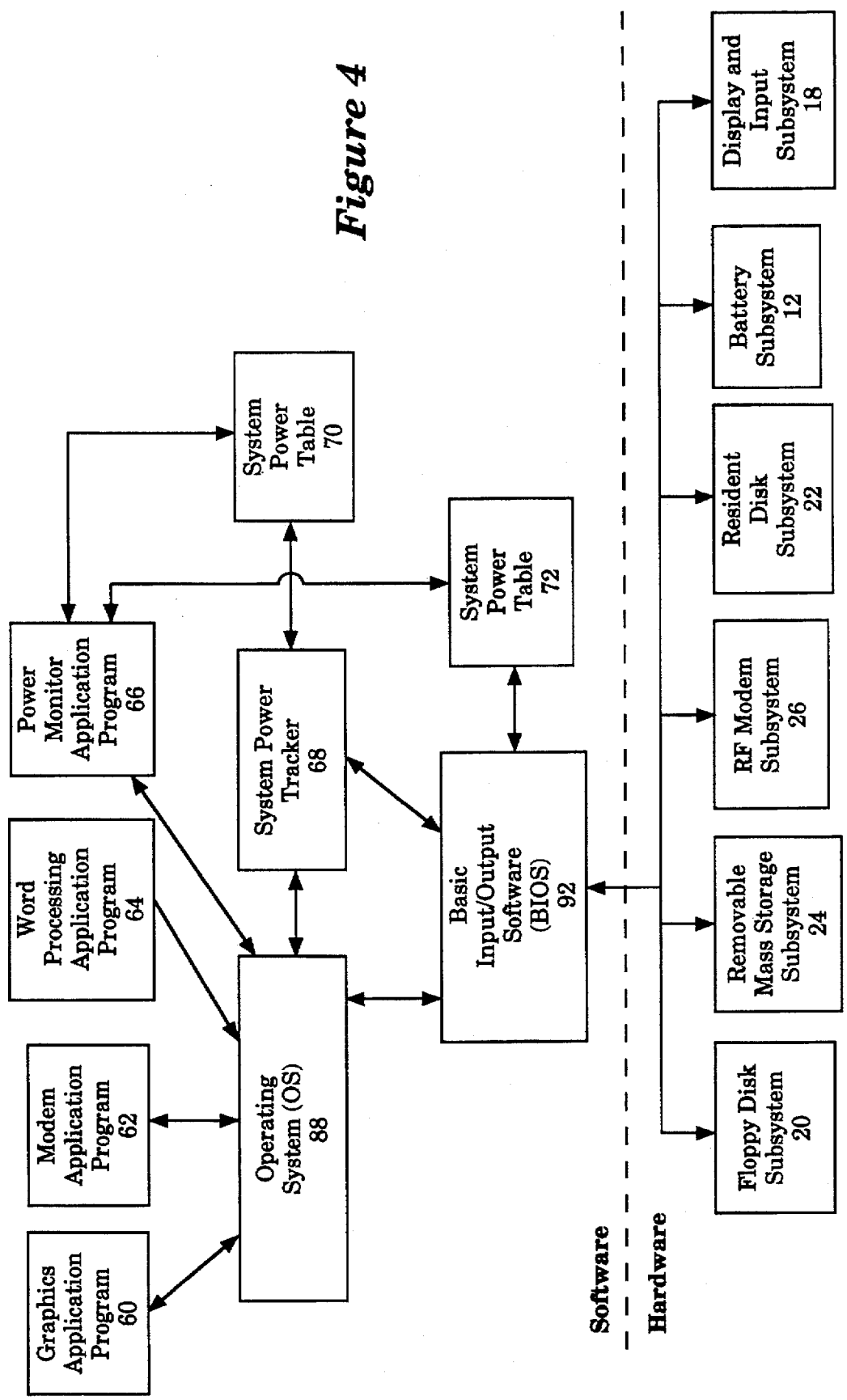
FIG. 4 illustrates the software architecture of the computer system for one embodiment which includes an operating system (OS), a set of basic input/output software (BIOS), and system power tables.

FIG. 4 illustrates the software architecture of the computer system 10 for one embodiment. The software architecture of the computer system 10 includes an operating system (OS) 88, a set of basic input/output software (BIOS) 92, and a set of application programs 60–66.

The operating system 88 provides a set of system services to the application programs 60–66 and corresponding device driver programs including user interface functions through the display and input subsystem 18 in conjunction with the BIOS 92. The application programs 60–66 also use the operating system 88 to access a set of hardware driver functions provided by the BIOS 92.

The BIOS 92, or a hardware abstraction layer, provides a set of hardware functions that enable access to the devices of the computer system 10 including the floppy disk subsystem 20, the resident disk subsystem 22, the removable mass storage subsystem 24, and the RF modem subsystem 26. In addition, the BIOS 92 includes functions that detect the devices installed in the computer system 10 and that monitor for insertion and removal of removable devices such as the removable mass storage system 24. The BIOS 92 also provides "plug and play" functions that facilitate installation of input/output devices and subsystems into standardized slots in the computer system 10.

The BIOS 92 includes a set of battery driver routines for querying the battery subsystem 12 to determine system power consumption. For one embodiment, the battery driver routines of the BIOS 92 transfer battery messages to the microprocessor 34 including the battery level query messages. The BIOS 92 uses the battery level query messages to determine the system power consumption of the computer system 10 from the battery/power supply 30. For another embodiment, the battery driver routines of the BIOS 92 include routines for sampling the power meter 40 to determine system power consumption of the computer system 10.

For one embodiment, the operating system 88 implements a set of power control functions that include functions that control power states of the processor subsystem 14. The power states of the processor subsystem 14 include various low power or slow processor clock speed states. The low power or slow processor clock speed states lower the power consumption of the processor subsystem 14 in a power consumption versus processor performance tradeoff. For another embodiment, the BIOS 92 implements the power control functions that control the power states and processor clock speed of the processor subsystem 14.

The application programs 60–66 include a graphics application program 60, a modem application program 62, and a word processing application program 64. The system hardware power consumption of the computer system 10 varies according to the activities and functions of the graphics application program 60, the modem application program 62, and the word processing application program 64.

For example, the graphics application program 60 performs multidimensional graphics display functions on the display portion of the display and input subsystem 18. The graphics application 60, such as a computer aided design package, performs computationally intensive three dimensional matrix calculations to provide the graphics functions. The execution of the graphics application program 60 by the processor subsystem 14 prevents the power management functions of the operating system 88 or the BIOS 92 from entering lower power or clock speed states during the computational intensive tasks.

The modem application program 62 performs data modem and fax transfers through the RF modem subsystem 26. The power consumption of the RF modem subsystem 26 is largely governed by the power consumption of the RF circuitry within the RF modem subsystem 26. As a consequence, the power consumption of the computer system 10 increases during data modem and fax transfers by the modem application program 62.

The word processing application program 64 performs word processing functions through the display and input subsystem 18. The execution of the graphics application program 60 by the processor subsystem 14 generally does not prevent the power management functions of the operating system 88 or the BIOS 92 from entering lower power or lower clock speed states during word processing tasks.

The software architecture of the computer system 10 also includes a system power tracker 68. The system power tracker 68 executes as a background task on the computer system 10. The system power tracker 68 invokes the services of the BIOS 92 to sense the hardware configuration of the computer system 10. The system power tracker 68 senses differing hardware configurations and then maintains a log of the hardware configurations in a system power table 70. The system power tracker 68 logs the maximum system power consumption, the minimum system power consumption, and the average system power consumption in the system power table 70 for each unique hardware configuration.

The system power tracker 68 also invokes the services of the operating system 88 to determine which application programs are currently executing on the computer system 10. The system power tracker 68 periodically queries the operating system 88 for a list of currently executing application programs. The system power tracker 68 then logs the software configurations of the computer system 10 in relation to hardware configurations in the system power table 70. The system power tracker 68 detects differing software configurations in the computer system 10 and logs the maximum system power consumption, the minimum system power consumption, and the average system power consumption in a system power table 72 for each unique software configuration.

The system power tracker 68 invokes the battery driver routines of the BIOS 92 to determine the system power consumption of the computer system 10 for differing hardware configurations maintained in the system power table 70 along with each unique software configuration in the system power table 70. The system power tracker 68 periodically updates the system power table 70 for the differing software configurations detected through the operating system 88. In addition, the system power tracker 68 creates new entries in the system power table 70 upon detection of a new arrangement of application programs executing on the computer system 10.

For another embodiment, the system power tracking functions for the computer system 10 are contained within the BIOS 92. For this embodiment, the system power consumption tracking routines in the BIOS 92 detect differing hardware configurations in the computer system 10 and log the maximum system power consumption, the minimum system power consumption, and the average system power consumption for each unique hardware configuration in a system power table 72. The system power table 72 is contained within persistent storage such as the static memory 21. The system power consumption tracking routines in the BIOS 92 periodically update the hardware configurations in the system power table 72 and create new entries when new hardware configurations are detected.

The software architecture of the computer system 10 also includes a power monitor application program 66. The power monitor application program 66 accesses the information contained in the system power table 70 or 72 to predict battery life before recharging or replacement is required for the battery subsystem 12. The power monitor application program 66 uses the parameters from the appropriate data set in the system power table 70 or 72 to predict battery time remaining or render power management decisions in the computer system 10. The power management decisions include, for example, spin down of the resident disk subsystem 22 according to access time-out or dimming the display to make available power to other devices in the system.

The power monitor application program 66 accesses the information contained in the system power table 70 or 72 and displays the information to the user by invoking the user interface functions of the operating system 88. The power monitor application program 66 invokes the services of the BIOS 92 and the operating system 88 in the manner previously described to determine the current hardware and/or software configuration of the computer system 10. The power monitor application program 66 then searches the system power table 70 or 72 for a data set corresponding to the current hardware/software configuration and reads the logged power consumption information from that data set.

For one embodiment, the power monitor application program 66 invokes battery driver routines in the BIOS 92 that enable application programs and device driver programs to transfer at_rate_time_remaining messages to the battery subsystem 12 and to receive corresponding response messages from the battery subsystem 12. The at_rate_time_remaining battery message includes an electrical current value.

The microprocessor 34 processes the at_rate_time_remaining message by determining the amount of time that the specified electrical current level is available from the battery/power supply 30. The microprocessor 34 then transfers the indicated time remaining in a message to the processor subsystem 14 via the battery control lines 42. The power monitor application program 66 uses the returned time remaining to provide a user interface display of time remaining at the current hardware/software configuration.

Figure 5:
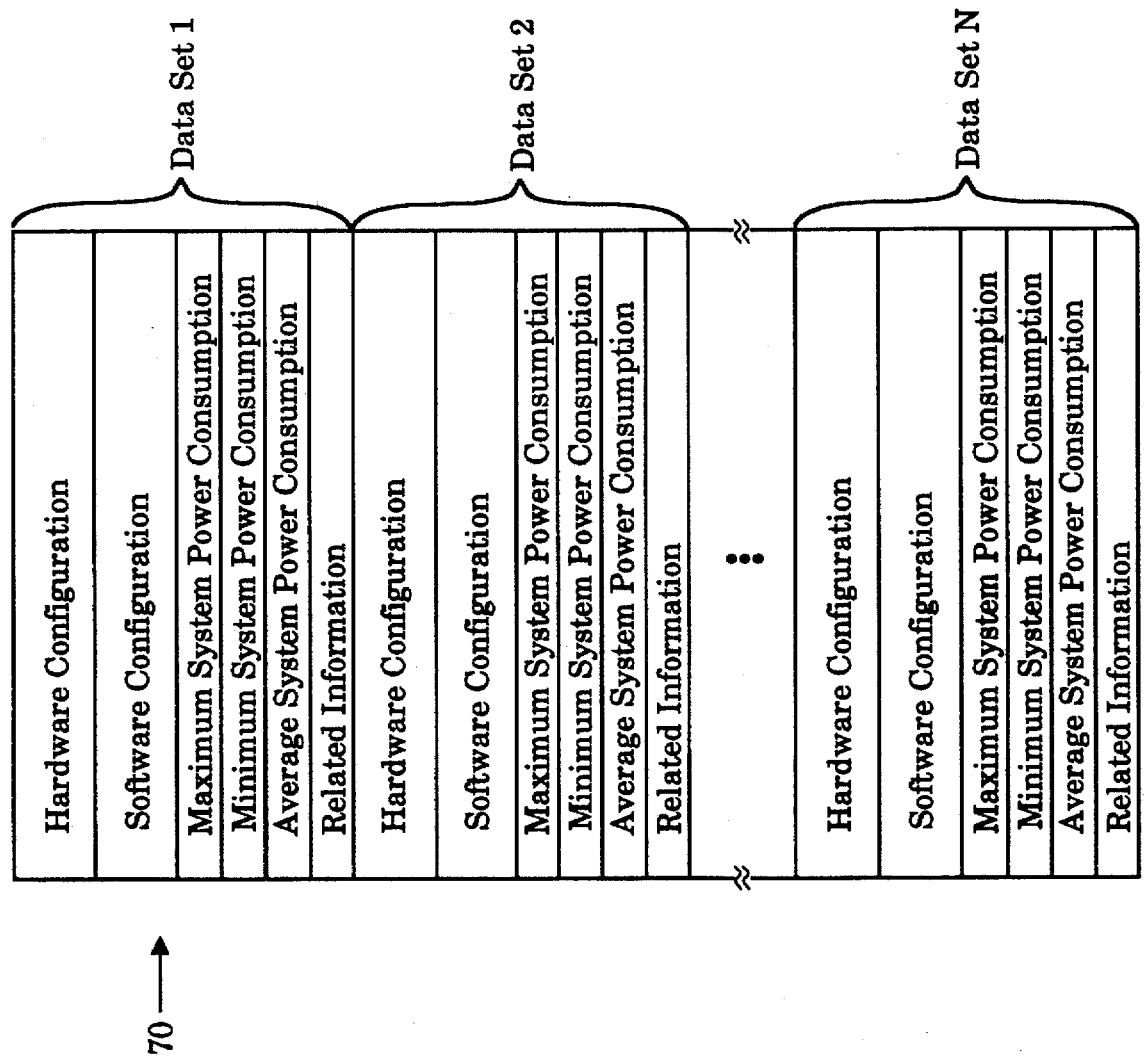
FIG. 5 illustrates the format of a system power table which contains system power consumption data for differing hardware and software configurations of the computer system.

FIG. 5 illustrates the format of the system power table 70 for one embodiment. The system power table 70 contains system power consumption data for differing hardware and software configurations of the computer system 10. The system power table 72 is similar to the system power table 70 and contains system power consumption data for differing hardware configurations but does not log software configuration information.

The system power table 70 is subdivided into a set of data sets 1-N. Each data set includes a hardware configuration, a software configuration, a maximum system power consumption value for that hardware/software configuration, a minimum system power consumption for that hardware/software configuration, an average system power consumption value for that hardware/software configuration and a set of related information for that hardware/software information.

The related information in a data set 1-N includes, for example, an indication of time span between the measurements by the system power tracker that update the corresponding data set as well as the time and date of the first measurement and the last measurement for the corresponding data set. In addition, the related information may include the time spent by the processor subsystem 14 in idle states and in full on states or differing processor clock speed states.

For another embodiment, the system power table 70 provides similar information as discussed above on a per device basis for each device in the computer system 10.

Figure 6:
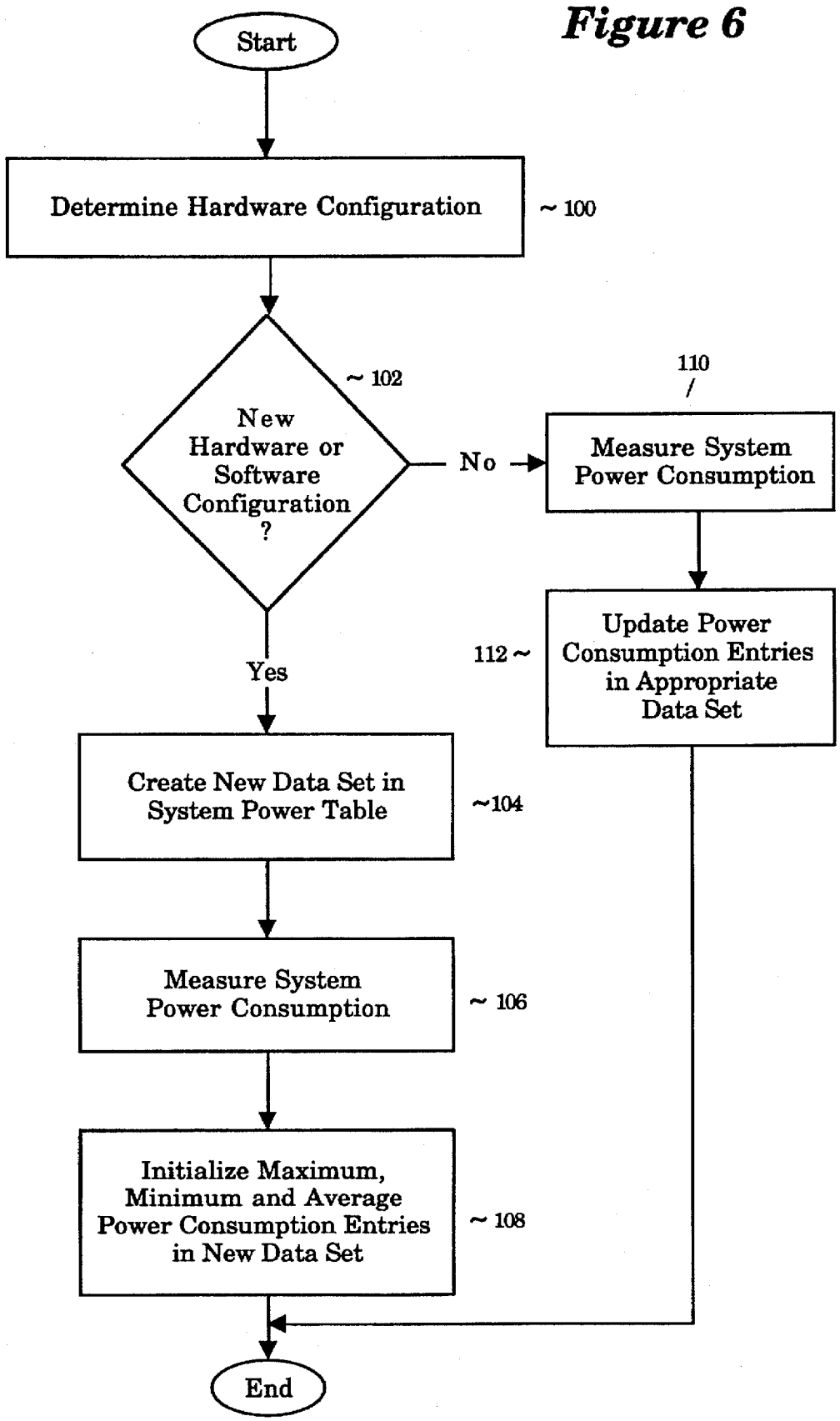
FIG. 6 is a flow diagram illustrating a system power consumption tracking routine of the BIOS for one embodiment.

FIG. 6 is a flow diagram illustrating the system power consumption tracking routine of the BIOS 92 for one embodiment. At block 100, the system power consumption tracking routine determines the hardware configuration of the computer system 10. The system power consumption tracking routine determines the hardware configuration by invoking functions of the BIOS 92 that sense the presence of the floppy disk subsystem 20, the removable mass storage subsystem 24, the RF modem subsystem 26, and the resident disk subsystem 22 as well as other devices in the computer system.

At decision block 102, the system power consumption tracking routine determines whether the hardware configuration determined at block 100 is a new or novel hardware configuration. The system power consumption tracking routine determines whether the hardware configuration is new by searching for the hardware configuration in the system power table 72. If none of the data sets 1-N in the system power table 72 contain the hardware configuration detected at block 100, then control proceeds to block 104.

At block 104, the system power consumption tracking routine of the BIOS 92 creates a new data set in the system power table 72 to reflect the new hardware configuration. Thereafter at block 106, the system power consumption tracking routine measures the system power consumption of the computer system 10 via the metering function provided by the battery subsystem 12.

For one embodiment, the system power consumption tracking routines of the BIOS 92 measure the system electrical power consumption by invoking the battery driver routines of the BIOS 92 to transfer battery query messages to the microprocessor 34. The battery driver routines of the BIOS 92 enables the system power consumption tracking routine to query the level of electrical currents being supplied via the power lines 46. For another embodiment the system power consumption tracking routines in the BIOS 92 determines system power consumption by reading the power meter 40 via the signal lines 44.

At block 108, the system power consumption tracking routine initializes the maximum system power consumption value, the minimum system power consumption value, and the average system power consumption value in the newly created data set of the system power table 72 with the power measurement obtained at block 106.

If a new hardware configuration is not detected at decision block 102, then control proceeds to block 110. At block 110, the system power consumption tracking routine measures the system power consumption of the computer system 10 in the manner previously described. Thereafter, at block 112 the system power consumption tracking routine updates the power consumption entries in the appropriate data set of the system power table 72 for the hardware configuration detected at block 100. The system power consumption tracking routine updates the maximum system power consumption value if necessary, the minimum system power consumption value if necessary, and the average system power consumption value in the corresponding previously logged data set for that hardware configuration.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded as illustrative rather than a restrictive sense.

What is claimed is:

1. A method for power consumption tracking and reporting in a computer system, comprising the steps of:

in a background task, determining a hardware configuration of the computer system by detecting the devices installed and whether a data set for the hardware configuration is stored in a system power table;

if the data set is stored, then the background task updates an indication of system power consumption for the hardware configuration in the data set;

if the data set is not stored, then the background task creates a new data set in the system power table that includes the indication of system power consumption for the hardware configuration.

2. The method of claim 1, further comprising the steps of determining an average power consumption for the hardware configuration and storing the average power consumption in the system power table.

3. The method of claim 1, further comprising the steps of determining a minimum power consumption for the hardware configuration and storing the minimum power consumption in the system power table.

4. The method of claim 1, further comprising the steps of determining a maximum power consumption for the hardware configuration and storing the maximum power consumption in the system power table.

5. The method of claim 1, further comprising the steps of:
determining a software configuration of the computer system and whether a data set for the software configuration is stored in the system power table;

if the software configuration is stored, then updating an indication of system power consumption for the software configuration in the data set;

if the software configuration is not stored, then creating a new data set in the system power table for the software configuration that includes the indication of system power consumption for the software configuration.

6. The method of claim 5, further comprising the steps of determining an average power consumption for the software configuration and storing the average power consumption for the software configuration in the system power table.

7. The method of claim 5, further comprising the steps of determining a minimum power consumption for the software configuration and storing the minimum power consumption for the software configuration in the system power table.

8. The method of claim 5, further comprising the steps of determining a maximum power consumption for the software configuration and storing the maximum power consumption for the software configuration in the system power table.

9. An apparatus for power consumption tracking and reporting in a computer system, comprising:
means for determining a hardware configuration of the computer system during a background task and during the background task determining whether a data set for the hardware configuration is stored in a system power table;

means for updating an indication of system power consumption for the hardware configuration in the data set if the data set is stored;

means for creating a new data set in the system power table that includes the indication of system power consumption for the hardware configuration if the data set is not stored.

10. The apparatus of claim 9, further comprising means for determining an average power consumption for the hardware configuration and storing the average power consumption in the system power table.

11. The apparatus of claim 9, further comprising means for determining a minimum power consumption for the hardware configuration and storing the minimum power consumption in the system power table.

12. The apparatus of claim 9, further comprising means for determining a maximum power consumption for the hardware configuration and storing the maximum power consumption in the system power table.

13. The apparatus of claim 9, further comprising:
means for determining a software configuration of the computer system and whether a data set for the software configuration is stored in the system power table;

means for updating an indication of system power consumption for the software configuration in the data set if the software configuration is stored;

means for creating a new data set in the system power table for the software configuration that includes the indication of system power consumption for the software configuration if the software configuration is not stored.

14. The apparatus of claim 13, further comprising means for determining an average power consumption for the software configuration and storing the average power consumption for the software configuration in the system power table.

15. The apparatus of claim 13, further comprising means for determining a minimum power consumption for the software configuration and storing the minimum power consumption for the software configuration in the system power table.

16. The apparatus of claim 13, further comprising means for determining a maximum power consumption for the software configuration and storing the maximum power consumption for the software configuration in the system power table.

17. A computer system having a set of hardware including a persistent storage and that executes a task that determines whether a data set for a configuration of the hardware is stored in a system power table in the persistent storage and that updates an indication of system power consumption for the configuration in the data set if the data set is stored and that creates a new data set in the system power table that includes the indication of system power consumption for the configuration if the data set is not stored.

18. The computer system of claim 17, wherein the task determines an average power consumption for the configuration and stores the average power consumption in the system power table.

19. The computer system of claim 17, wherein the task determines a minimum power consumption for the configuration and stores the minimum power consumption in the system power table.

20. The computer system of claim 17, wherein the task determines a maximum power consumption for the configuration and stores the maximum power consumption in the system power table.

21. The computer system of claim 17, wherein the task determines a software configuration of the computer system and whether a data set for the software configuration is stored in the system power table and that then updates an indication of system power consumption for the software configuration in the data set if the data set for the software configuration is stored and that creates a new data set in the system power table for the software configuration that includes the indication of system power consumption for the software configuration if the data set for the software configuration is not stored.

22. The computer system of claim 21, wherein the task determines an average power consumption for the software configuration and stores the average power consumption for the software configuration in the system power table.

23. The computer system of claim 21, wherein the task determines a minimum power consumption for the software configuration and stores the minimum power consumption for the software configuration in the system power table.

24. The computer system of claim 21, wherein the task determines a maximum power consumption for the software configuration and stores the maximum power consumption for the software configuration in the system power table.

25. The computer system of claim 17, wherein power management software for the computer system uses information from the system power table to determine a battery life for a battery subsystem of the computer system.

26. The computer system of claim 17, wherein power management software for the computer system uses information from the system power table to render a power management decision for the computer system.

27. The computer system of claim 26, wherein the power management decision is whether to spin down a disk drive in the computer system.

28. The computer system of claim 26, wherein the power management decision is whether to dim a display in the computer system.

* * * * *